United States Patent [19]

Suhir et al.

[11] Patent Number: 5,627,407
[45] Date of Patent: May 6, 1997

[54] ELECTRONIC PACKAGE WITH REDUCED BENDING STRESS

[75] Inventors: Ephraim Suhir, Randolph; John D. Weld, Succasunna, both of N.J.

[73] Assignee: Lucent Technologies Inc., Murray Hill, N.J.

[21] Appl. No.: 430,664

[22] Filed: Apr. 28, 1995

[51] Int. Cl.$^6$ .................................................. H01L 23/053
[52] U.S. Cl. ............................ 257/701; 257/702; 257/787
[58] Field of Search .............................. 257/787, 701, 257/702, 703, 687

[56] References Cited

U.S. PATENT DOCUMENTS

| | | | |
|---|---|---|---|
| 4,887,148 | 12/1989 | Mu | 257/687 |
| 5,173,840 | 12/1992 | Kodai et al. | 257/687 |
| 5,213,864 | 5/1993 | Wong | 257/787 |
| 5,233,130 | 8/1993 | Nishino | 257/787 |

FOREIGN PATENT DOCUMENTS 5235201  9/1993  Japan ................................ 257/702

*Primary Examiner*—Sara W. Crane
*Assistant Examiner*—Roy Potter
*Attorney, Agent, or Firm*—Glen E. Books; Eugen E. Pacher

[57] ABSTRACT

In accordance with the invention, electronic packages comprising a layer of molded plastic on one side of an insulating substrate are provided with a surrogate layer on the side of the substrate opposite the molded plastic to reduce bending stress. The surrogate layer is preferably thin, has a high coefficient of thermal expansion and is resistant to high tensile stress. Advantageously, the surrogate layer is processed concurrently with the molding of the plastic. Preferred surrogate layers are low temperature thermoplastic sheets, such as acetal plastic sheets, that soften at the molding temperature sufficiently to bond to the substrate. Alternatively, they can be higher temperature rigid materials, such as glass fiber composites, bonded to the substrate with an adhesive layer that cures during molding.

9 Claims, 1 Drawing Sheet

ELECTRONIC PACKAGE WITH REDUCED BENDING STRESS

FIELD OF THE INVENTION

This invention relates to the packaging of electronic components such as integrated circuits and, in particular, to an improved package of the type comprising a layer of molded plastic encapsulating integrated circuits or other devices on one side of an insulating substrate. The improved packages utilize a surrogate layer on the side of the substrate opposite the molded plastic to reduce bending stress.

BACKGROUND OF THE INVENTION

A number of recently developed microelectronic package designs consist of a relatively thick molded plastic, typically thermosetting epoxy molding compounds, encapsulating integrated circuits or other devices on one side of a thin insulating substrate. This substrate, which can be a ceramic, an epoxy glass, or some other insulating material is prone to failure because of the elevated bending stresses caused by thermal expansion mismatch between the molded plastic layer and the substrate in the package. The stress-free state of a molded device is typically at or close m the molding temperature, (usually in the range of 170°–180° C). During the subsequent cooling of the package to room temperature, thermally induced bending stresses occur in the package. These resulting elevated bending stresses, which may lead to bowing or cracking of the substrate, are undesirable. An immediate postbaking operation at the molding temperature of the package taken directly from the mold may not be sufficient in reducing the bending stresses to a safe level eliminating bowing. Appreciable thermally induced bowing and high thermal stresses occur even in conventional ball grid array (BGA) packages which typically utilize FR4 or BT epoxy glass substrate materials with coefficients of thermal expansion close to those of epoxy molding compounds. Accordingly, there is a need for a packaging arrangement which reduces bending stress.

SUMMARY OF THE INVENTION

In accordance with the invention, electronic packages comprising a layer of molded plastic on one side of an insulating substrate are provided with a surrogate layer on the side of the substrate opposite the molded plastic to reduce bending stress. The surrogate layer is preferably thin, has a high coefficient of thermal expansion and is resistant to high tensile stress. Advantageously, the surrogate layer is processed concurrently with the molding of the plastic. Preferred surrogate layers are low temperature thermoplastic sheets, such as acetal plastic sheets, that soften at the molding temperature sufficiently to bond to the substrate. Alternatively, they can be higher temperature rigid materials, such as glass fiber composites, bonded to the substrate with an adhesive layer that cures during molding.

Brief Description of the Drawings The advantages, nature and various additional features of the invention will appear more fully upon consideration of the illustrative embodiments now to be described in detail in connection with the accompanying drawings. In the drawings.

It is to be understood that these drawings are for purposes of illustrating the concepts of the invention and are not to scale.

DETAILED DESCRIPTION

This description is divided into two parts. Part I describes the general features of a package using a surrogate layer to reduce bending stress, and Part II presents an analytical model useful for optimizing the surrogate layer in various applications.

I. The Features of the Package

Figure 1:
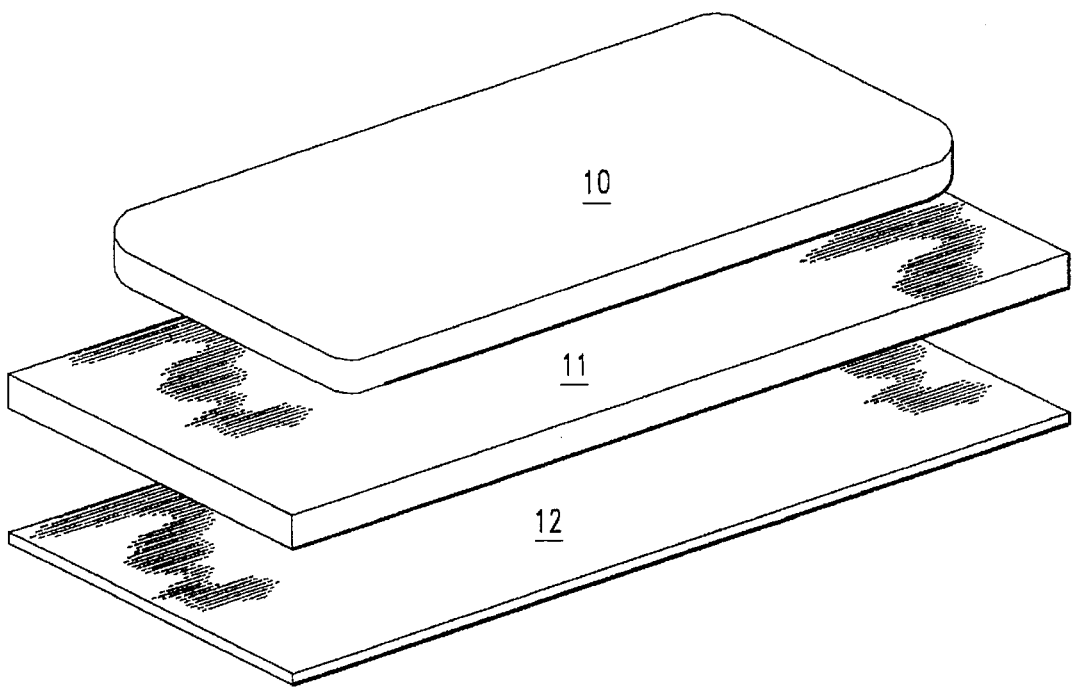
FIG. 1 is an exploded view of an electronic package.

Referring to the drawings, FIG. 1 is an exploded view showing the three main components of an electronic package in accordance with the invention. Specifically, the package comprises a body of molded plastic 10, such as a thermosetting epoxy molding compound, an insulating substrate 11 and a surrogate layer 12 such as a thin layer of thermoplastic material. The molded plastic 10 typically encapsulates one or more electronic devices such as integrated circuits (not shown). The substrate 11 is typically a fragile material such as an insulating ceramic or ferrite which needs to be protected from bending stresses. The surrogate layer is a thin layer typically less than 2 mm thick and preferably in the range of 0.25 to 1.0 mm in thickness. The layer has a high coefficient of thermal expansion greater than $40 \times 10^{-6}/°C$. and preferably in the range $50 \times 10^{-6}/°C$. to $80 \times 10^{-6}/°C$. It is advantageous if it is resistant to tensile stresses higher than 10,000 Kgf/cm$^2$. Exemplary useful materials for surrogate layers include acetal resin, acrylic resin and fiber reinforced composites. The preferred surrogate layer is a glass fiber reinforced acetal sold under the trade name Delrin by E. I. duPont.

Figure 2:
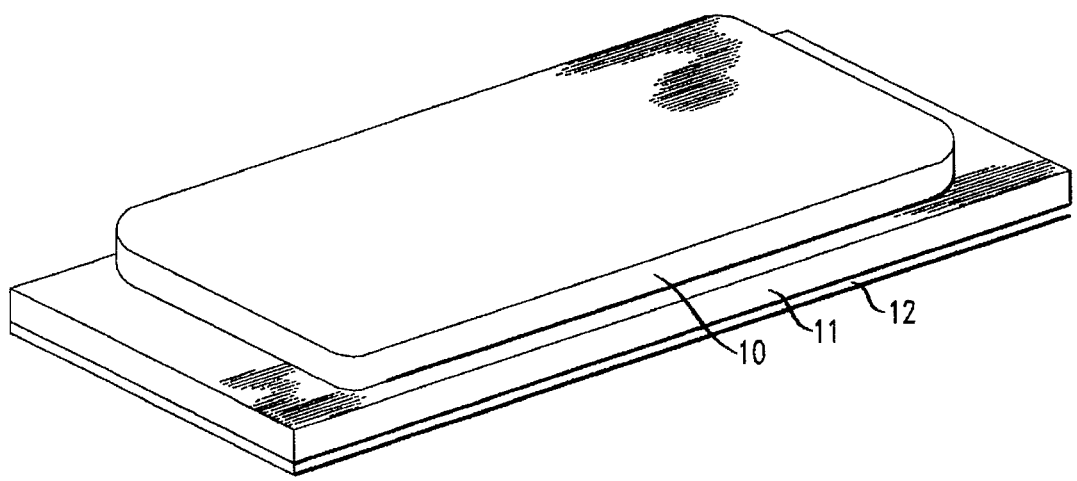
FIG. 2 is a perspective view of the package with its components in place.

As better shown in FIG. 2, the surrogate layer 12 is disposed on the side of the substrate opposite the molded plastic 10. The structure is advantageously fabricated in such a fashion that the surrogate layer bonds to the substrate during the molding of the plastic 10 on the substrate. This concurrent fabrication creates a desirable stress balance in the composite structure during cooling.

The analysis that follows presents a calculation procedure to determine the required thickness of the surrogate layer material for the given allowable stress in the substrate. It is assumed that the surrogate layer that this material is molded concurrently with the "main" package.

II Analytical Model

We now analyze an ideal tri-material structure similar to FIG. 2 consisting of an epoxy molding compound body, a ferrite substrate, and a surrogate material layer, molded at an elevated temperature and subsequently cooled down to room temperature. The stresses in the constituent materials (with 1 referring to the surrogate material, 2 referring to the ferrite substrate, and 3 referring to the molding compound) can be evaluated from the following simplified equations of the compatibility of the interfacial strains, $$-\alpha_1 \Delta t + \lambda_1 T_1 - \frac{h_1}{2} \kappa = -\alpha_2 \Delta t - \lambda_2 T_2 + \frac{h_2}{2} \kappa \quad (1)$$

$$-\alpha_2 \Delta t - \lambda_2 T_2 - \frac{h_2}{2} \kappa = -\alpha_3 \Delta t + \lambda_3 T_3 + \frac{h_3}{2} \kappa, \quad (2)$$

the equilibrium equation for the induced forces, $$T_1 - T_2 + T_3 = 0, \quad (3)$$

and the equilibrium equation for the induced bending moments $$-\left(\zeta_c - \frac{h_1}{2}\right)T_1 + \quad (4)$$

$$\left(\zeta_c - h_1 - \frac{h_2}{2}\right) T_2 + \left(h_1 + h_2 + \frac{h_3}{2} - \zeta_c\right) T_3 = EI\kappa$$

In these equations, $\alpha_i$, $i=1,2,3$, are the coefficients of thermal expansion (contraction) of the components, $h_i$, $i=1,2,3$, are their thicknesses, $\zeta_c$ is the distance of the neutral plane from the outer surface of the surrogate layer, $\Delta t$ is the change in temperature, $$\lambda_i = \frac{1 - \nu_i}{E_i h_i}, \quad i = 1, 2, 3$$

are the in-plane compliances of the components, $E_i$ and $\nu_i$, $i=1,2,3$, are the elastic constants of the materials, $EI$ is the flexural rigidity of the composite structure, $T_i$, $i=1,2,3$, are the unknown thermally induced forces in the components, and $\kappa$ is the unknown curvature of the assembly. The equations (1) and (2) indicate that the interfacial longitudinal strains must be the same for the adjacent materials. The equation (3) reflects the requirement that the thermally induced forces must be in equilibrium, as well as an assumption (not critical) that the ferrite material is in compression, while the molding compound and surrogate materials are in tension. The equation (4), which is the equilibrium equation for the bending moments, is formed, for the sake of convenience, with respect to the neutral plane of the structure. The first terms in the equations (1) and (2) are unrestricted (stress-free) contractions; the second terms are due to tension or compression of the given component under the action of the thermally induced force, and are evaluated on the basis of Hooke's law; and the third terms account for the additional strains caused by bending.

The coefficients of thermal expansion (contraction) and the elastic constants—Young's modulus and Poisson's ratio—are assumed constant in the above equations. This assumption is valid if the glass transition temperatures of the molding compound and the surrogate material exceed the molding temperature. If this is not the case, a more accurate analysis may be necessary.

The equations (1), (2), (3), and (4) can be rewritten as follows:

$$\left.\begin{array}{l}\lambda_1 T_1 + \lambda_2 T_2 - \beta_{12}\kappa = (\alpha_1 - \alpha_2)\Delta t \\ \lambda_2 T_2 + \lambda_3 T_3 + \beta_{23}\kappa = (\alpha_3 - \alpha_2)\Delta t \\ T_1 - T_2 + T_3 = 0 \\ a_1 T_1 - a_2 T_2 - a_3 T_3 + EI\kappa = 0\end{array}\right\} \quad (5)$$

where the following notation is used:

$$a_1 = \zeta_c - \frac{h_1}{2}, \quad a_2 = \zeta_c - h_1 - \frac{h_1}{2}, \quad (6)$$

$$a_3 = h_1 + h_2 + \frac{h_3}{2} - \zeta_c,$$

$$\beta_{12} = \frac{h_1 + h_2}{2}, \quad \beta_{23} = \frac{h_2 + h_3}{2}. \quad (7)$$

From the equations (5) we obtain the following formulas for the forces $T_1$ and $T_2$, acting on the surrogate layer material and the substrate, and the curvature $\kappa$ of the structure:

$$T_1 = \frac{D_1}{D}, \quad T_2 = \frac{D_2}{D}, \quad \kappa = \frac{D_\kappa}{D}. \quad (8)$$

Here $$D_1 = \{\alpha_1[\lambda_2+\lambda_3)EI+\beta_{23}{}^2]-\alpha_2(\lambda_3 EI + \beta_{13}\beta_{23})-\alpha_3(\lambda_2 EI-\beta_{12}\beta_{23})\}\Delta t$$

$$D_2 = \{_1\lambda_3 EI+\beta_{13}\beta_{23})-\alpha_2[(\lambda_1+\lambda_3)EI+\beta_{13}{}^2]+\alpha_3(\lambda_1 EI+\beta_{12}\beta_{23})\}\Delta t \quad (9)$$

$$D_\kappa = \{-\alpha_1(\lambda_2\beta_{13}+\lambda_3\beta_{12})-\alpha_2(\lambda_1\beta_{23}-\lambda_3\beta_{12}+\alpha_3(\lambda_1\beta_{23}+\lambda_2\beta_{13})\}\Delta t$$

and the determinant of the equations (5) is $$D = EI(\lambda_1\lambda_2 + \lambda_1\lambda_3 + \lambda_2\lambda_3) + \lambda_1\beta_{23}{}^2 + \lambda_2\beta_{13}{}^2 + \lambda_3\beta_{12}{}^2. \quad (10)$$

In the equations (9) and (10), $$\beta_{13} = \beta_{12} + \beta_{23} = \frac{h_1 + h_3}{2} + h_2. \quad (11)$$

The formulas (8) enable one to evaluate the tensile force $T_1$ in the surrogate layer, the compressive force $T_2$ in the ferrite substrate, and the curvature $\kappa$ for the given geometry of the structure and material properties.

The distance $\zeta_c$ of the neutral plane from the outer surface of the surrogate material layer can be evaluated as $$\zeta_c = \frac{E_1 \frac{h_1{}^2}{2} + E_2 h_2\left(h_1 + \frac{h_2}{2}\right) + E_3 h_3\left(h_1 + h_2 + \frac{h_3}{2}\right)}{E_1 h_1 + E_2 h_2 + E_3 h_3}.$$

Then the flexural rigidity of the package is as follows:

$$EI = \frac{E_1 h_1{}^3 + E_2 h_2{}^3 + E_3 h_3{}^3}{12} + E_1 h_1\left(\zeta_c - \frac{h_1}{2}\right)^2 +$$

$$E_2 h_2\left(\zeta_c - h_1 - \frac{h_2}{2}\right)^2 + E_3 h_3\left(h_1 + h_2 + \frac{h_3}{2} - \zeta_c\right)^2.$$

Since $$\zeta_c - \frac{h_1}{2} = \frac{E_2 h_2 \beta_{12} + E_3 h_3 \beta_{13}}{E_1 h_1 + E_2 h_2 + E_3 h_3}$$

$$\zeta_c - h_1 - \frac{h_2}{2} = \frac{-E_1 h_1 \beta_{12} + E_3 h_3 \beta_{23}}{E_1 h_1 + E_2 h_2 + E_3 h_3}$$

$$h_1 + h_2 + \frac{h_3}{2} - \zeta_c = \frac{E_1 h_1 \beta_{13} + E_2 h_2 \beta_{23}}{E_1 h_1 + E_2 h_2 + E_3 h_3}$$

we obtain:

$$\begin{aligned} EI &= \frac{E_1 h_1{}^3 + E_2 h_2{}^3 + E_3 h_3{}^3}{12} + \quad (12) \\ &\quad \frac{1}{(E_1 h_1 + E_2 h_2 + E_3 h_3)^2}\{E_1 h_1 (E_2 h_2 \beta_{12} + E_3 h_3 \beta_{13})^2 + \\ &\quad E_2 h_2(-E_1 h_1 \beta_{12} + E_3 h_3 \beta_{23})^2 + E_3 h_3(E_1 h_1 \beta_{13} + E_2 h_2 \beta_{23})^2\} \\ &= \frac{E_2 h_2{}^3}{12}\{1 + \eta_1{}^3 e_1 + \eta_3{}^3 e_3 + \\ &\quad 12\frac{1}{(1+\eta_1 e_1 + \eta_3 e_3)^2}(\eta_1 e_1(\bar\beta_{12} + \eta_3 e_3 \bar\beta_{13})^2 + \\ &\quad (-\eta_1 e_1 \bar\beta_{12} + \eta_3 e_3 \bar\beta_{23})^2 + \eta_3 e_3(\eta_1 e_1 \bar\beta_{13} + \hat\beta_{23})^2)\} \end{aligned}$$

where the following notation is used:

$$e_1 = \frac{E_1}{E_2}, \quad e_3 = \frac{E_3}{E_2}, \quad \eta_1 = \frac{h_1}{h_2}, \quad \eta_3 = \frac{h_3}{h_2}, \quad (13)$$

$$\bar\beta_{12} = \frac{\beta_{12}}{h_2} = \frac{1+\eta_1}{2}, \quad \bar\beta_{13} = \frac{\beta_{13}}{h_2} = \frac{1+\eta_1+\eta_3}{2},$$

-continued $$\bar{\beta}_{23} = \frac{\beta_{23}}{h_2} = \frac{1+\eta_3}{2}.$$

The maximum stresses in the surrogate material and the ferrite substrate can be calculated as $$\sigma_1 = \sigma_{1b} + \sigma_{1c} = \frac{E_1 h_1^3}{12} \kappa + \frac{T_1}{h_1} = \frac{1}{D}\left(\frac{E_1 h_1^3}{12} D_\kappa + \frac{D_1}{h_1}\right) \quad (14)$$

and $$\sigma_2 = \sigma_{2b} - \sigma_{2c} = \frac{E_2 h_2^3}{12} \kappa + \frac{T_2}{h_2} = \frac{1}{D}\left(\frac{E_2 h_2^3}{12} D_\kappa - \frac{D_2}{h_2}\right) \quad (15)$$

The first terms in these equations are bending stresses and the second terms consider the effect of compression (tension). The obtained relationships enable one to establish the thickness of the surrogate material in such a way that the stresses $\sigma_1$ and $\sigma_2$ do not exceed the allowable levels.

The application of this analysis will become evident by consideration of the following numerical example. For the example, consider the tri-material structure (FIG. 2) consisting of a ferrite substrate, an epoxy molding compound body, and a thin surrogate layer. Let the thicknesses of the molding compound and the substrate be $h_3=1.905$ mm and $h_2=1.270$ mm, respectively, their Young's moduli be $E_3=2.0$ Mpsi=1406 kgf/mm$^2$ and $E_2=24.66$ Mpsi=17342 kgf/mm$^2$, and the coefficients of thermal expansion be $\alpha_3=12\times10^{-6}$ 1/° C. and $\alpha_2=7\times10^{-6}$ 1/° C. Let the molding temperature be $t_c=170°$ C., and the glass transition temperature of the molding compound and the surrogate layer be $t_g=180°$ C., i.e., higher than the molding temperature. Therefore the mechanical properties of the molding compound can be assumed temperature independent. Let the candidate surrogate layer material be such that its Young's modulus is $E_1=30.00$ Mpsi=21097 kgf/mm$^2$ and its coefficient of thermal expansion is $\alpha_1=60\times10^{-6}$ 1/° C. the ferrite material be able to withstand a bending stress not higher than $\sigma_2=200$ kgf/cm$^2$. The calculated curvatures, $\kappa$, and stresses, $\sigma_1$, and, $\sigma_2$, in the surrogate materials and in the ferrite, respectively, when the tri-material structure is cooled down to room temperature ($\Delta t=170-25=145°$ C.), are shown in Table 1.

material leads to substantial compressive stresses in the ferrite, this circumstance should be viewed as a favorable factor which can possibly result in improved fracture toughness of the ferrite material. The obtained data indicate also that the surrogate material should be strong enough to withstand tensile stress as high as 27000 kgf/cm$^2$, and not experience creep deformations under the action of such a high stress.

The developed calculation procedure enables one to establish the appropriate thickness of the surrogate layer for the given mechanical properties of the materials in the package (including the surrogate material itself) and the thicknesses of the basic materials in the package.

It is to be understood that the above-described embodiments are illustrative of only a few of the many possible specific embodiments which can represent applications of the principles of the invention. Numerous and varied other arrangements can be made by those skilled in the art without departing from the spirit and scope of the invention.

The invention claimed is:

1. In a package for electronic components comprising a body of molded plastic on one side of insulating substrate, said body of molded plastic having a molding temperature and containing one or more electronic components, and said insulating substrate subject to bending stress caused by thermal expansion mismatch with said molded plastic, the improvement wherein:

said substrate is provided with a surrogate layer on the side opposite said molded plastic body, said surrogate layer having a thickness less than 2 mm, and a coefficient of thermal expansion greater than $40\times10^{-6}$/°C. for reducing the bending stress on said substrate at a temperature below said molding temperature.

2. The improved package of claim 1 wherein said surrogate layer has a thickness in the range 0.25–1.00 mm.

3. The improved package of claim 1 wherein said surrogate layer has a coefficient of thermal expansion in the range $50\times10^{-6}$/°C. to $80\times10^{-6}$/°C., and wherein the temperature below the molding temperature includes room temperature.

4. The improved package of claim 1 wherein said surrogate layer comprises thermoplastic resin.

5. The improved package of claim 1 wherein said surrogate layer comprises fiber-reinforced thermoplastic resin.

TABLE 1

Predicted Stresses In Ferrite Substrate for Varying Thicknesses of Surrogate Layer.

| $h_1$ (mm) | $1.0 \times 10^{-6}$ | 0.010 | 0.020 | 0.030 |
|---|---|---|---|---|
| EI (kgf · mm) | 9788.454 | 9926.409 | 10065.451 | 10205.580 |
| D (mm$^3$/kgf) | $1.435 \times 10^2$ | $1.479 \times 10^{-2}$ | $7.617 \times 10^{-3}$ | $5.229 \times 10^{-3}$ |
| $D_1$ (mm$^2$) | $3.927 \times 10^{-2}$ | $3.954 \times 10^{-2}$ | $3.982 \times 10^{-2}$ | $4.010 \times 10^{-2}$ |
| $D_2$ (mm$^2$) | $2.019 \times 10^{-2}$ | $6.576 \times 10^{-2}$ | $5.599 \times 10^{-2}$ | $5.294 \times 10^{-2}$ |
| $D_\kappa$ (mm$^2$/kgf) | $3.273 \times 10^{-2}$ | $1.644 \times 10^{-6}$ | $-2.877 \times 10^{-9}$ | $-5.582 \times 10^{-7}$ |
| $\kappa$ (l/mm) | $2.281 \times 10^{-4}$ | $1.111 \times 10^{-4}$ | $-3.777 \times 10^{-7}$ | $-1.068 \times 10^{-4}$ |
| $\sigma_{1b}$ (kgf/mm$^2$) | 0.000 | $1.954 \times 10^{-7}$ | $-5.312 \times 10^{-9}$ | $-5.068 \times 10^{-6}$ |
| $\sigma_{1c}$ (kgf/mm$^2$) | 273.625 | 267.394 | 261.408 | 255.656 |
| $\sigma_1$ (kgf/mm$^2$) | 273.625 | 267.394 | 261.408 | 255.656 |
| $\sigma_{2b}$ (kgf/mm$^2$) | 0.6751 | 0.3290 | −0.0011 | −0.3160 |
| $\sigma_{2c}$ (kgf/mm$^2$) | −1.1076 | −3.5014 | −5.7874 | −7.9715 |
| $\sigma_2$ (kgf/mm$^2$) | −0.4325 | −3.1725 | −5.7885 | −8.2874 |

As can be seen from the computed data, the application of a 0.02 mm thick surrogate layer enables one to bring down the bending stress from 67.51 kgf/cm$^2$ in the absence of the surrogate layer (this stress exceeds significantly the allowable bending stress) to a next-to-zero bending stress. Although, at the same time, the application of the surrogate 6. The improved package of claim 1 wherein said surrogate layer comprises glass-reinforced acetal resin.

7. The improved package of claim 1 wherein said body of plastic comprises thermosetting epoxy molding compound; said insulating substrate comprises ceramic and said surrogate layer comprises fiber-reinforced thermoplastic resin.

8. The improved package of claim 7 wherein said insulating substrate comprises ferrite and said fiber-reinforced thermoplastic resin comprises glass-fiber reinforced acetal resin.

9. The improved package of claim 1 wherein said surrogate layer is resistant to tensile stresses higher than 10,000 Kgf/cm$^2$.

* * * * *